United States Patent [19]
Gruszka et al.

[11] 4,010,488
[45] Mar. 1, 1977

[54] ELECTRONIC APPARATUS WITH OPTIONAL COUPLING

[75] Inventors: Raymond F. Gruszka, Reading; Clarence A. Warczyglowa, Laureldale, both of Pa.

[73] Assignee: Western Electric Company, Inc., New York, N.Y.

[22] Filed: Nov. 21, 1975

[21] Appl. No.: 634,211

[52] U.S. Cl. .................................. 357/70; 357/65; 357/68; 357/69; 357/71; 174/52 S; 361/400; 361/402

[51] Int. Cl.² ................. H01L 23/48; H01L 29/44; H01L 29/52; H01L 29/60

[58] Field of Search ................. 357/65, 67, 68, 69, 357/71, 74, 70; 174/52 S; 317/101 A, 101 CC

[56] References Cited
UNITED STATES PATENTS

| | | | |
|---|---|---|---|
| 3,262,022 | 7/1966 | Caracciolo | 357/74 |
| 3,287,610 | 11/1966 | Reber | 357/74 |
| 3,457,639 | 7/1969 | Weller | 357/74 |
| 3,497,947 | 3/1970 | Ardezzone | 357/74 |
| 3,546,543 | 12/1970 | Hessinger | 357/74 |
| 3,627,901 | 12/1971 | Happ | 174/52 S |
| 3,893,156 | 7/1975 | Riseman | 357/69 |

*Primary Examiner*—Andrew J. James
*Attorney, Agent, or Firm*—M. Y. Epstein; G. W. Houseweart

[57] ABSTRACT

In the manufacture of certain types of electronic devices, a plurality of leads are simultaneously bonded in side-by-side relation to a corresponding number of "active" bonding sites or pads on a substrate, the "active" pads being the ends of conductive paths on the substrate. Particularly narrow active bonding pads are used to minimize the possibility of shorting together adjacent pads by leads which are not properly aligned on centers with the pads. Electrically isolated "dummy" pads, comprising relatively small metallized areas are not connected to conductive paths, are provided on the substrate between each active pad. Portions of the misaligned leads extending beyond the edges of the active pads overlap and are bonded to the dummy pads, thus minimizing the loss of bonding strength otherwise caused by the misalignment of the leads with the active pads.

12 Claims, 6 Drawing Figures

ELECTRONIC APPARATUS WITH OPTIONAL COUPLING

BACKGROUND OF THE INVENTION

This invention relates to electronic devices, and particularly, but not limited, to semiconductor devices of the type including a plurality of elongated leads bonded in side-by-side relation to conductive paths on a substrate.

One type of known semiconductor device comprises a substrate, e.g., of ceramic, having a fan-like (diverging) pattern of conductive paths on a surface thereof, and a semiconductor chip mounted face down on the substrate. Different conductive paths on the chip are electrically connected to different ones of the substrate paths at the area of convergence thereof. The diverging substrate paths terminate at bonding pads, generally disposed along edges of the substrate, and elongated metal conductive members or leads are bonded to the bonding pads to provide electrical terminals for the completed device.

In the assembly of such devices, it is the practice to provide the device leads as part of a unitary assembly or frame. The leads are arrayed in a pattern corresponding to that of the substrate bonding pads whereby all the leads can be simultaneously aligned and simultaneously bonded to the bonding pads. The leading interconnecting portions of the lead frame are then removed leaving the leads bonded to and extending away from the substrate.

For purposes of miniaturization, it is desirable to space the bonding pads as closely together as possible on the substrates. One problem caused by such close spacing is that relatively slight misalignment of the lead frames with the substrates can cause shorting together of adjacent bonding pads by misaligned leads which are disposed between and in overlapped relation with adjacent pads rather than in contact with single ones only of the pads.

One solution to this problem is to simply increase the size of the substrates and the bonding pad spacings. This, of course, is contrary to achieving maximum miniaturization. Another solution is the use of more complex and accurate lead frame alignment apparatus. This involves greater capital expense. A third solution is to reduce the width of the bonding pads or the leads, or both, thus reducing the likelihood of adjacent pads being spanned and shorted together by the leads. A limit to how far this solution could heretofore be extended, however, is that below a minimum area of contact between the leads and the bonding pads, such contact area being a function of the width of the leads and pads, the strength of adhesion of the leads to the substrate is inadequately small.

One object of this invention is to provide an arrangement wherein, without significantly reducing the strength of the bonds between the leads and the substrates, or increasing the size of the devices, the likelihood of shorting together adjacent bonding pads by misaligned leads is reduced.

DETAILED DESCRIPTION

Figure 1:
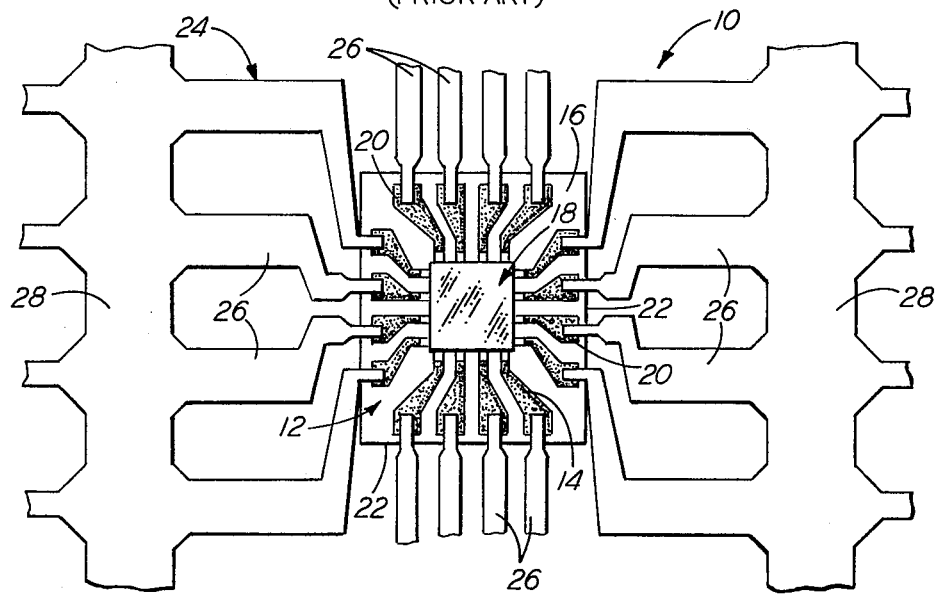
FIG. 1 is a plan view of a portion of a prior art sub-assembly of the type with which the instant invention has utility.

An example of a prior art semiconductor device sub-assembly is shown in FIG. 1, the sub-assembly 10 comprising a substrate 12 of, e.g., alumina ceramic, having a pattern of diverging metallic conductive paths 14 on a surface 16 thereof. A semiconductor wafer or chip 18 is mounted face down on a central portion of the substrate 12, conductive portions on the chip 18 being connected, as by soldering or thermo-compression welding or the like to different ones of the inner or converged ends of the substrate paths 14. The outer or diverged ends 20 of the paths 14 are disposed in a side-by-side relationship along edges 22 of the substrate 12, the path ends 20 being referred to as "bonding sites" or "bonding pads" since it is to these ends that conductive members, e.g., the device terminal leads, are bonded.

In the fabrication of the sub-assembly 10, it is the practice to bond the device terminal leads to the substrate 12 using a known type lead frame 24, a portion of which is shown in FIG. 1. The frame 24 includes all the leads 26 to be bonded to the sub-assembly 10, the various leads 26 being held together by lead connecting members 28 in an array corresponding to that of the bonding pads 20 on the substrate 12. Thus, in the lead bonding operation, the lead frame 24 is first aligned with the substrate 12 using simple fixturing (not shown) so that each lead 26 is aligned on centers with a different bonding pad 20, and all the leads 26 are then simultaneously bonded, e.g., by known thermo-compression or ultra-sonic bonding techniques or the like, to the bonding pads.

The frame connecting members 28 are then cut away from the frame 24 leaving the leads 26 bonded to and extending away from the substrate 12. As known, the leads 26, the pads 20, and the conductive paths 14 provide a preselected electrical interconnecting scheme by means of which each lead 26 is electrically connected to a preselected portion of the chip 18.

Figure 2:
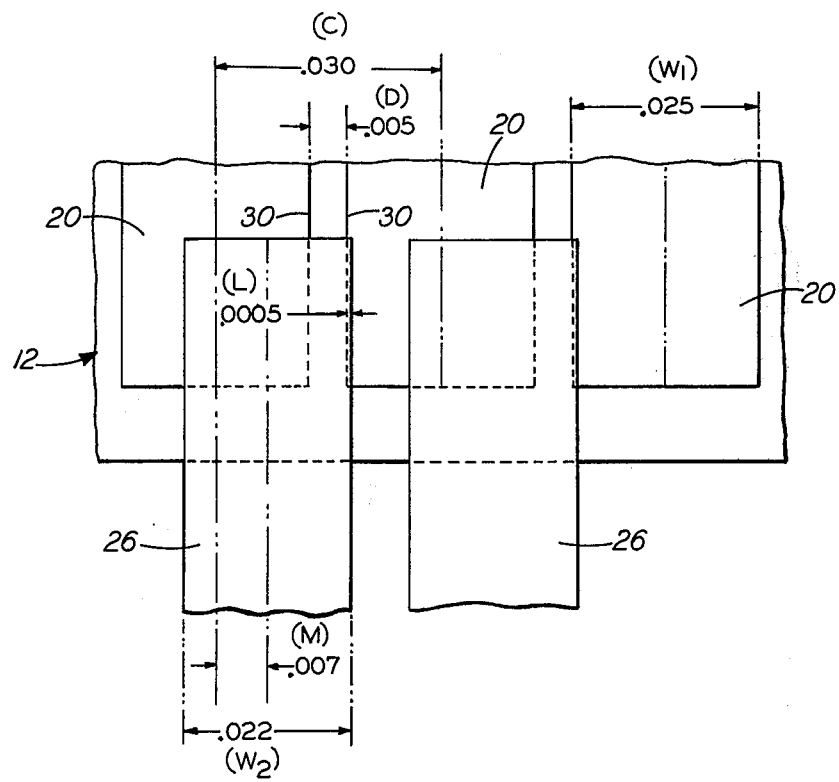
FIG. 2 is an enlarged plan view of a portion of the device shown in FIG. 1 illustrating a lead to bonding pad misalignment pattern.

As previously noted, a problem with this known fabrication process is that occasionally, due to improper alignment of the lead frame 24 relative to the substrate, the various leads 26 are not aligned on centers with the bonding pads 20, but are misaligned therewith, as shown in FIG. 2. In one prior art device, for example, the bonding pads 20 have a width $W_1$ of 25 mils and have a center-to-center spacing C of 30 mils, the distance D between facing sides 30 of adjacent pads 20 thus being 5 mils. The leads 26 have a width $W_2$ after bonding (the leads tending to be flattened and widened in "pressure" type bonding processes) of 22 mils. Thus, any off-center misalignment of the leads 26 relative to the bonding pads 20 in excess of 6.5 mils results, as shown in FIG. 2, in the overlapping and shorting together of adjacent pads 20 by the misaligned leads. In FIg. 2, the lead to pad center-to-center misalignment M is 7 mils, the lead overlap L of the adjacent pad being 0.5 mil.

Figure 3:
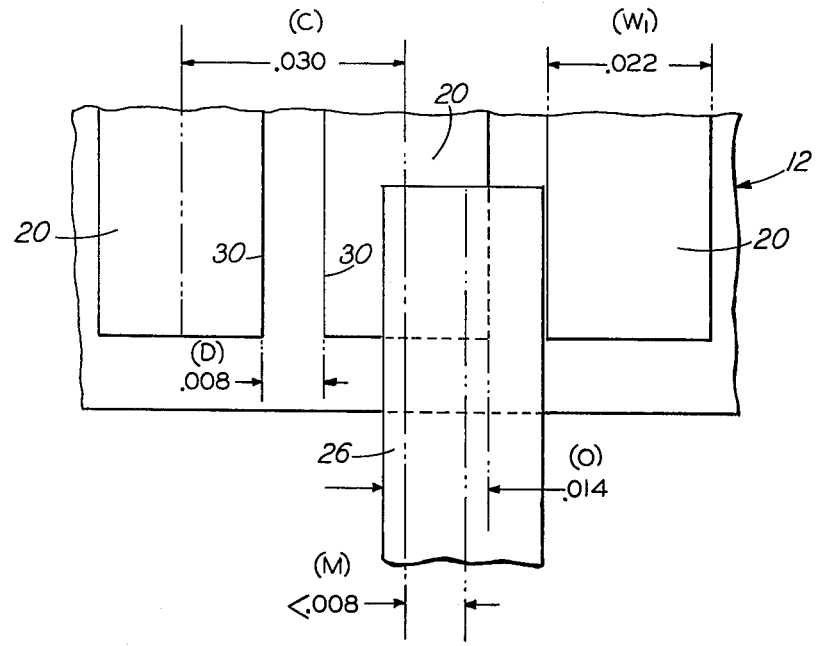
FIG. 3 is a view similar to that of FIG. 2 showing one prior art arrangement for reducing the likelihood of shorting together adjacent bonding pads.

One known means to reduce the likelihood of such overlapping and shorting together of adjacent pads is to reduce the width of either the pads 20 or the leads 26, or both. Thus, for example, if the width $W_1$ of the pads is reduced to 22 mils, as shown in FIG. 3, all other dimensions remaining the same, the distance D between facing sides 30 of adjacent pads 20 is increased to 8 mils. Thus, the amount of permissible center-to-center misalignment M (neglecting dimensional tolerances) of the leads and pads without causing shorting is increased from just up to 6.5 mils to just up to 8 mils. (Hereinafter, for the purpose of simplifying the discussion, the phrase, "just up to," and phrases of like import, are omitted. Also, in the drawings, the symbol "<" is used to mean "just less than." For example, in FIG. 3, the misalignment M is designated as "<0.008", meaning a dimension just less than 8 mils.)

A difficulty with the above-described solution, however, is that with a maximum, non-shorting lead to pad misalignment M of 8 mils, the overlap O of each lead 26 with the pad 20 to which it is intended to mate is 14 mils. That is, instead of the bond between the leads 26 and the bonding pads 20 having a width of 22 mils, as is the case when the leads 26 are bonded on centers with the pads 26, the bond width is only 14 mils due to the lead to pad misalignment. While this reduced amount of bond width may or may not be acceptable with respect to providing adequate strength of the bonds between the leads and the substrate (the contacting of the leads with the unmetallized surface portions of the substrate contributing no strength to the lead-substrate adhesion), it is clear that reducing the width of the bonding pads or leads in accordance with this known solution can go just so far before unacceptably weak bonds are produced.

In accordance with this invention, the use of quite narrow bonding pads is made possible without significant sacrifice in bonding strength. Thus, with reference to FIG. 4, a portion of a substrate 12 is shown containing otherwise conventional metallized paths 34 terminating, however, in unusually narrow bonding pads 36, e.g., of a width $W_1$ of 18 mils (although not shown, the conductive paths 34 are connected to a semiconductor chip mounted on the substrate 12 as is shown in FIG. 1). Disposed on either side of each of the "active" (i.e., electrically interconnected) pads 36 is a metallized "dummy" bonding pad 38 to which no conductive path is connected. That is, in comparison with the "active" bonding pads 36, the "dummy" bonding pads 38 are not extensions of conductive paths and do not serve any intentional electrical interconnecting function. The purpose of the dummy pads 38 is to provide substrate metallized surfaces to which misaligned leads will bond, thus providing an adequately strong adhesion of the leads to the substrate in spite of relatively narrow contacting of the leads with the active pads 36. This will be explained in greater detail hereinbelow.

Figure 4:
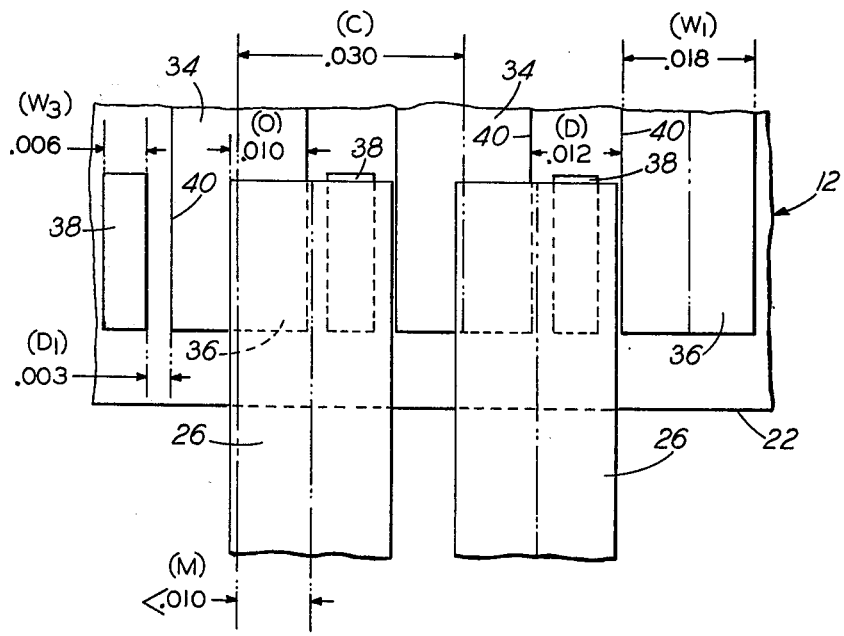
FIG. 4 is a view similar to that of FIG. 3 but showing a bonding pad arrangement according to the instant invention.

In the embodiment of the invention shown in FIG. 4, the active bonding pads 36 have a width $W_1$ of only 18 mils and are spaced on 30 mil centers C. The distance D between facing sides 40 of adjacent ones of the active pads 36 is thus 12 mils, and the maximum permissible off-center misalignment M of the 22 mil wide leads 26 with respect to the active pads 36 is 10 mils. That is, provided the misalignment of the centers of the leads 26 with respect to the centers of the pads 36 is less than 10 mils (neglecting parts tolerances), overlapping of the leads with and shorting together of adjacent pads 36 does not occur. This range of permissible lead to bond pad misalignment is greater than that of the prior art devices hereinbefore described.

With a maximum misalignment of 10 mils, as shown in FIG. 4, the overlap O of each lead 26 with its corresponding or mating active pad 36 is only 10 mils. In general, such a small width contacting of the leads 26 and the pads 36 might not provide adequate adhesion of the leads to the substrate 12.

As shown in FIG. 4, however, the misaligned leads 26 overlap the dummy pads 38 and are bonded thereto. In this embodiment, for example, each dummy pad 38 has a width $W_3$ of 6 mils and is spaced a distance $D_1$ 3 mils from a side 40 of each of the active pads 36. Thus, the overlap of the leads 26 with the dummy pads 38, in this example, is 6 mils, and the total width of those portions of the leads which are bonded to metallized surface portions of the substrate is 16 mils, i.e., a 10 mil wide lead portion O bonded to the pad 36, plus the 6 mil wide lead portion bonded to the pad 38.

In summary, the illustrative device shown in FIG. 4 uses active bonding pads 36 having a width of only 18 mils, thus allowing a maximum lead to pad 36 misalignment of 10 mils, while still providing a total lead to substrate bond width of 16 mils. For purposes of comparison, it is noted that the prior art device shown in FIG. 3, which uses bonding pads 20 of a width of 22 mils, provides, at a maximum permissible lead to pad misalignment of 8 mils, a lead to pad bond width of only 14 mils. Thus, the instant invention provides a means for increasing the allowable lead to substrate mismatch while not sacrificing lead bond strength.

The misalignment of the leads relative to the bonding pads occurs on a random basis from device to device. Thus, while the leads 26 are shown in FIG. 4 as being misaligned to the right of the pads 36, misalignment of the leads to the left of the pads can also occur. In either case, overlapping and bonding of the leads with a dummy pad 38 can occur, thus minimizing the loss of bonding strength due to such misalignment. Moreover, regardless of which dummy pads 38 are overlapped, i.e., those to the right or those to the left of the pads 36, the preselected electrical interconnection scheme between the leads 26 and the various portions of the semiconductor chip is not altered due to the electrical isolation of the dummy pads 38 on the substrate 12.

Of importance with respect to the direction of misalignment of the leads in the FIG. 4 embodiment of the invention, however, is the requirement that all the leads be misaligned (if at all) in the same direction, either to the right or left. If this were not the case, i.e., if two adjacent leads were misaligned in directions towards one another, these leads would be shorted together by mutual contact with the intermediate dummy pad 38. Fortunately, such type of different direction misalignment rarely if ever occurs due to the relatively high accuracy with which both the bonding pad pattern and the lead frames are conventionally formed; the basic problem of lead to bonding pad misalignment occurring as a result of inaccuracies of the fixturing arrangement used to align the lead frames with the substrates.

The dummy pads of the type shown herein can be provided by conventional techniques and materials, and are preferably provided simultaneously with and as part of the processes used to provide the "active" bonding pads. In one embodiment for example, the various bonding pads and conductive paths on the substrate comprise a 1000 A thick first layer of titanium in direct contact with the substrate, an 800 A thick second layer of palladium covering the first layer, and a 20,000 A thick third layer of gold covering the second layer.

Because the bonds between the dummy pads and the misaligned leads increase the strength of adhesion of the leads to the substrate, the dummy pads are preferably made as wide as possible, i.e., the spacing between the dummy pads and the adjacent active pads is preferably made as small as practical consistent with electrical insulating and manufacturing tolerance requirements.

Also, because the dummy pads serve no intentional or preselected electrical interconnecting function, the dummy pads are preferably (to conserve space on the substrate) of a length not significantly in excess of the length of overlap of the leads with the substrate. For example, in one embodiment, all the bonding pads are spaced 3 mils from an edge 22 (FIG. 4) of the substrate 12, the dummy bonding pads 38 having a length of 25 mils, and the leads 26 overlap the substrate a distance of about 23 mils.

Figure 5:
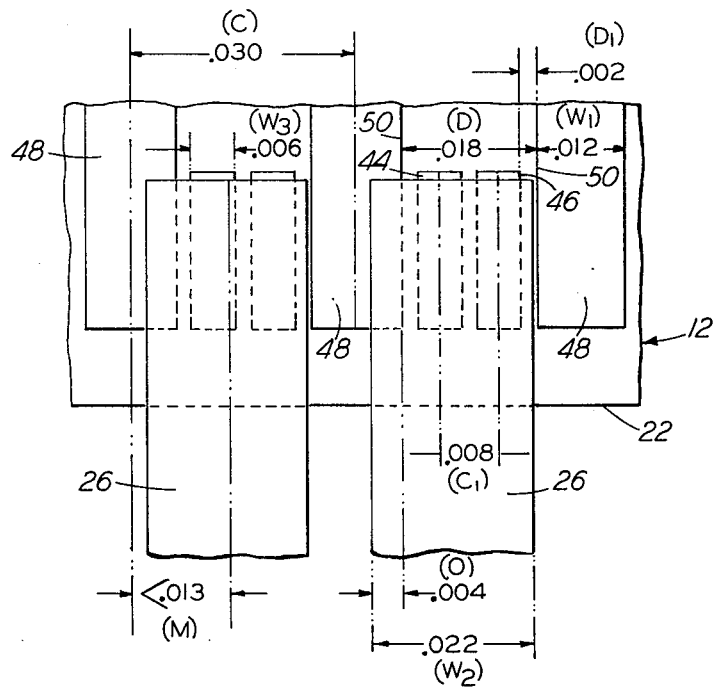
FIG. 5 is a view similar to that of FIG. 4 but showing a different embodiment of the invention.

Another embodiment of the invention is shown in FIG. 5. In this embodiment, two dummy bonding pads 44 and 46 are disposed between each pair of active pads 48. Advantages of this arrangement are that even more narrow (in comparison with the FIG. 4 embodiment) active bonding pads can be used, thus further increasing the permissible lead to bonding pad misalignment, while the likelihood of shorting together adjacent leads misaligned in directions towards one another is reduced.

Thus, in the embodiment shown in FIG. 5, the center-to-center spacing C of the active pads 48 is 30 mils, the width $W_1$ of the active pads is only 12 mils, and the distance D between facing sides 50 of adjacent active pads 48 is 18 mils. Using leads 26 having a bonded width $W_2$ of 22 mils, the maximum permissible lead to pad mismatch M without causing shorting of adjacent active pads 48 is 13 mils (in comparison with the permissible mismatch of 10 mils in the FIG. 4 embodiment). Each dummy pad 44 and 46 has a width $W_3$ of 6 mils, the center to center spacing $C_1$ between adjacent dummy pads 44 and 46 is 8 mils, and the distance $D_1$ between each dummy pad and its immediately adjacent active pad 48 is 2 mils.

Under conditions of maximum permissible lead to active pad mismatch, as shown in FIG. 5, the overlap O between the leads 26 and the active pads 48 is only 4 mils. However, both dummy pads 44 and 46 are fully overlapped by each lead 26, and the total width of the bond between each lead 26 and metallized surface portions of the substrate 12 is 16 mils (the same as that provided in the FIG. 4 embodiment). Thus, without sacrifice of bond area and thus bond strength, greater permissible lead to pad misalignment is provided.

Figure 6:
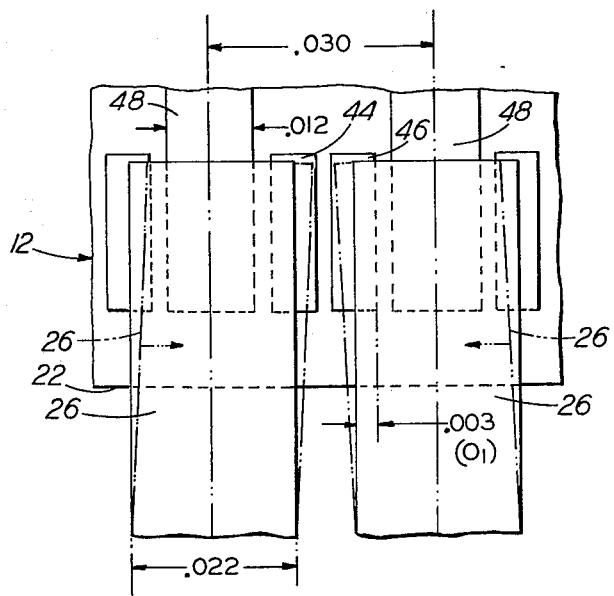
FIG. 6 is a view similar to that of FIG. 5 further illustrating certain advantages of this embodiment of the invention.

The reason two dummy pads 44 and 46 are used rather than one, as is the case in the FIG. 4 embodiment, is illustrated in FIG. 6 which shows (in solid lines) a condition in which the leads 26 are perfectly aligned on centers with the active pads 48. Because the bonded leads 26 have a width which is 10 mils greater than that of the active pads 48, a 3 mil overlap $O_1$ of each lead 26 with the dummy pads 46 and 48 on opposite sides of each active pad 48 occurs. As is clear from this Figure, if the two dummy pads 46 and 48 were not electrically separate from one another, but comprised a single pad, adjacent pairs of leads 26 would be shorted together by contact with such single dummy pad.

FIG. 6 also illustrates, in broken lines, a condition in which adjacent leads 26 are misaligned (as by being bent) in directions towards one another. Again, because of the use of two dummy pads, rather than one, shorting together of such misaligned leads does not occur.

The invention is not limited in its applicability to the particular type device described above. For example, the invention also has utility in the attachment of the leads of known "beam lead" semiconductor chips to substrates on which the chips are mounted. Also, instead of comprising metallized paths on the substrates, the conductive "paths" between the bonding pads and the semiconductor chip, or other elements to which electrical contacts are to be made, can comprise known types of wires, straps, or the like.

In yet another embodiment, not illustrated, the semiconductor chip, in accordance with known techniques, is mounted directly on one of the leads of a lead frame, different portions of the chip are electrically connected to different ones of the frame leads by relatively wide bonding straps, and the chip, the bonding straps, and the inner ends of the leads are encapsulated in, e.g., a molded plastic envelope. The lead interconnecting portions of the frame are then removed leaving the leads extending outwardly from the device envelope. In accordance with this invention, to reduce the possibility of overlapping and shorting together of adjacent "active" leads during the bonding of the straps to the leads, the active leads are made more narrow than is typical, and dummy leads are provided interdigitated with the active leads of the lead frame in much the same fashion as described above in connection with the combination of active and dummy pads on a substrate. After encapsulation, the extending ends of the dummy leads are cut-off close to the device envelope simultaneously with the removal of the lead interconnecting portions of the frame.

Additionally, the invention is not limited in use to "semiconductor" devices, but can be used with electronic devices including non-semiconductor circuit elements, e.g., resistors, capacitors, and the like, to which electrical connections are made.

What is claimed is:

1. Electronic apparatus comprising a circuit element and means providing preselected electrical coupling to said element, said means including first and second spaced apart coupling sites and first and second conductive members individually coupled to said first and second sites, respectively; and a third coupling site disposed between and spaced from said first and second coupling sites, either one of said first and second conductive members being coupleable to its respective first or second coupling site and to said third site without altering said preselected electrical coupling.

2. Apparatus as in claim 1, wherein said first, second, and third coupling sites are bonding sites comprising an array of co-linear sites, and including two additional bonding sites co-linear with and on opposite sides of said array in adjacent, spaced relation with each of said first and said second sites, respectively, each of said conductive members being bondable to its respective first or second bonding site and to a site immediately adjacent to either side thereof without altering said preselected contacting.

3. Apparatus as in claim 1 wherein the coupling sites are bonding sites and additionally including two third bonding sites disposed between and spaced from said first and second sites and from each other.

4. Apparatus as in claim 3 in which each said conductive member has a width greater than that of its corresponding first or second site, and the spacing between each of said two third bonding sites and its immediately adjacent first or second site is such that each of said conductive members, when substantially aligned with its corresponding first or second bonding site, overlaps each third site on opposite sides of said corresponding first or second site.

5. Apparatus as in claim 1 including an insulating substrate, said coupling sites comprising metallized areas providing bonding sites on said substrate, said circuit element being mounted on said substrate, and including conductive paths extending between said first and second bonding sites and said element, and said third bonding site being electrically isolated, absent a connection thereto by said conductive members, from said element.

6. Electronic apparatus comprising:
a substrate of insulating material;
a first plurality of discrete, spaced bonding pads disposed along an edge of said substrate;
a plurality of spaced apart conductive paths on said substrate, with a first end of each of said paths coupled to a respective separate one of a plurality of said first bonding pads;
a circuit element mounted on said substrate and electrically coupled to second ends of said paths, thereby providing a preselected electrical interconnection arrangement between said first bonding pads and said element;
a plurality of second bonding pads on said substrate interdigitated with and spaced from said first pads along said substrate edge; and
a plurality of leads corresponding in number with said first bonding pads bonded one each to a different group of different ones of said pads, each of said pad groups including one of said first pads and at least one of said second pads on either side thereof, the said electrical interconnection arrangement being the same for either side-by-side grouping of pads.

7. Electronic apparatus as in claim 6 in which said leads overlap said substrate a preselected distance inwardly of said edge, and said second pads extend away from said edge not substantially in excess of said distance.

8. Electronic apparatus as in claim 6 including two second bonding pads disposed between each pair of adjacent first bonding pads.

9. Apparatus as recited in claim 6 wherein the circuit element is a semiconductor chip.

10. Apparatus as recited in claim 6 wherein the leads are bonded from a lead frame which holds the leads in fixed relative relationship.

11. Electronic apparatus including a circuit element and a plurality of discrete paths for simultaneously coupling a plurality of different electrical signals to and from said element; said paths including:
a first plurality of discrete, spaced, intermediate coupling sites disposed in substantially co-linear mutual relationship;
a plurality of discrete intermediate paths for coupling electrical signals between a plurality of said first coupling sites and different portions of the circuit element;
a second plurality of discrete, spaced coupling sites disposed at least one between each pair of adjacent ones of said first sites, said second sites being spaced from and electrically insulated from the first sites; and
said apparatus being adapted for coupling to a plurality of discrete, spaced external coupling paths, corresponding in number with said first sites, such that each path is electrically coupled to a different group of different ones of said sites, each of said groups including at least one of said first sites and at least one of said second sites on either side thereof, the said electrical coupling being the same for either side-by-side grouping of sites.

12. Apparatus as recited in claim 11 including two of said second sites between each pair of adjacent ones of said first sites.

* * * * *